US011092936B2

(12) United States Patent
Maegawa et al.

(10) Patent No.: US 11,092,936 B2
(45) Date of Patent: Aug. 17, 2021

(54) MACHINE CONTROL DEVICE, MACHINE CONTROL PROGRAM, AND MACHINE CONTROL METHOD

(71) Applicant: RESONEST CORPORATION, Tokyo (JP)

(72) Inventors: Hirotoshi Maegawa, Tokyo (JP); Keiko Ikemoto, Tokyo (JP); Akira Sassa, Tokyo (JP)

(73) Assignee: RESONEST CORPORATION, Tokyo (JP)

( * ) Notice: Subject to any disclaimer, the term of this patent is extended or adjusted under 35 U.S.C. 154(b) by 0 days.

(21) Appl. No.: 16/345,268

(22) PCT Filed: Oct. 27, 2017

(86) PCT No.: PCT/JP2017/038838
§ 371 (c)(1),
(2) Date: Apr. 26, 2019

(87) PCT Pub. No.: WO2018/079698
PCT Pub. Date: May 3, 2018

(65) Prior Publication Data
US 2019/0294127 A1    Sep. 26, 2019

(30) Foreign Application Priority Data
Oct. 28, 2016   (JP) .............................. JP2016-211704

(51) Int. Cl.
*G05B 13/04*    (2006.01)
*C30B 13/28*    (2006.01)
(Continued)

(52) U.S. Cl.
CPC ............ *G05B 13/042* (2013.01); *C30B 13/28* (2013.01); *C30B 15/22* (2013.01); *G05B 13/02* (2013.01)

(58) Field of Classification Search
CPC ...... G05B 13/042; G05B 13/02; C30B 13/28; C30B 15/22
See application file for complete search history.

(56) References Cited

U.S. PATENT DOCUMENTS 5,812,428 A * 9/1998 Zou ...................... G05B 13/021
318/561
5,968,263 A * 10/1999 Grover .................... C30B 15/14
117/14

(Continued)

FOREIGN PATENT DOCUMENTS

| JP | H03-152601 A | 6/1991 |
| JP | H04-108689 A | 4/1992 |

(Continued)

OTHER PUBLICATIONS

Apr. 30, 2019 International Preliminary Report on Patentability issued in the International Patent Application No. PCT/JP2017/038838.

(Continued)

*Primary Examiner* — Christopher E. Everett
(74) *Attorney, Agent, or Firm* — Oliff PLC

(57) ABSTRACT

A machine control device is configured to include a measurement unit that measures regarding a state of a controlled object handled by a machine apparatus, a determination unit that determines a constraint determination value by comparing the measurement result by the measurement unit with a predetermined constraint condition, control units and that perform operation control for the machine apparatus based on the constraint determination value determined by the determination unit according to the relationship set for the constraint determination value and the operation control, and a learning unit that reconfigures the relationship between the constraint determination value and the opera- (Continued)

tion control when the constraint determination value changes due to the operation control performed by the control units.

10 Claims, 4 Drawing Sheets

(51) Int. Cl.
    *C30B 15/22*     (2006.01)
    *G05B 13/02*     (2006.01)

(56) References Cited

U.S. PATENT DOCUMENTS

| | | | |
|---|---|---|---|
| 6,241,818 B1* | 6/2001 | Kimbel | ............... C30B 15/20 117/13 |
| 6,725,100 B1 | 4/2004 | Ewert | |
| 6,776,840 B1* | 8/2004 | Fuerhoff | ............... C30B 15/22 117/15 |

FOREIGN PATENT DOCUMENTS

| | | |
|---|---|---|
| JP | H09-077588 A | 3/1997 |
| JP | 2001-027903 A | 1/2001 |
| JP | 2001-209405 A | 8/2001 |
| JP | 2001-282306 A | 10/2001 |
| JP | 2005-339004 A | 12/2005 |

OTHER PUBLICATIONS

Jan. 16, 2018 Search Report issued in International Patent Application No. PCT/JP2017/038838.

* cited by examiner

MACHINE CONTROL DEVICE, MACHINE CONTROL PROGRAM, AND MACHINE CONTROL METHOD

TECHNICAL FIELD

The present invention relates to a machine control device, a machine control program, and a machine control method.

DESCRIPTION OF RELATED ART

Automatic control techniques for machine apparatuses are conventionally used in various technical fields. Specifically, for such a machine apparatus as various manufacturing devices and plant devices, the operation of machine apparatuses is commonly controlled so that the state of the controlled object matches a target state. This is based on the detection result of the state of the controlled object handled by the machine apparatus. Also recent known proposals include modeling the controlled object by estimating the characteristics etc. of the machine apparatus even without no past operation record. This enables the operation control in which the controlled target becomes a target state in the machine apparatus (see, e.g., Patent Document 1).

PRIOR ART DOCUMENT

Patent Document

Patent Document 1: Japanese Patent Application Laid-Open Publication No. 2001-209405.

SUMMARY OF THE INVENTION

Problem to be Solved by the Invention

However, in some machine apparatuses, it may be hard to perform an operation control by uniquely modeling the controlled object so as to keep a target state.

For example, if the controlled object alters its characteristics (temperature, viscosity, tension, etc.) over time, it is not always easy to uniquely model the controlled object. Such a difficult situation may include a case where the fluctuation of the state of the controlled object does not uniquely correspond to the operating state of the machine apparatus (such as when the characteristic fluctuation of the controlled object occurs due to various operations of the machine apparatus). If the operation of the machine apparatus continues for a long time, it is not practical to create a control model after attempting to perform the operation and figuring out a considerable amount of various phenomena in advance. In addition, automatic control of machine apparatuses generally works in real time. Some of reinforcement learning is not suitable to be applied if the learning is performed searching the best actions.

Therefore, the present invention aims to provide a machine control device, a machine control program, and a machine control method capable of controlling the operation of the machine apparatus so that the controlled object maintains the desired state. This is directed even if it is difficult to model the controlled object uniquely so as to control the operation to keep the target state.

Means for Solving the Problem

The present invention has been made to achieve the above objective and its several aspects are as follows.

According to one aspect of the present invention, there is provided a machine control device which is used by mounting on a machine apparatus that handles a controlled object or used by connecting to the machine apparatus, the machine control device including a measurement unit that performs measurement regarding a state of the controlled object, a determination unit that compares a measurement result with a predetermined constraint condition, the measurement result being obtained by the measurement unit, and determines a constraint determination value, a control unit that performs operation control for the machine apparatus based on the constraint determination value determined by the determination unit, according to a relationship set for the constraint determination value and the operation control, and a learning unit that reconfigures a relationship between the constraint determination value and the operation control when the constraint determination value changes due to the operation control performed by the control unit.

According to another aspect of the present invention, there is provided a machine control program causing a computer mounted on a machine apparatus that handles a controlled object or a computer used by connecting to the machine apparatus, to execute performing measurement regarding a state of the controlled object, comparing a measurement result with a predetermined constraint condition, the measurement result being obtained by the performance of the measurement, and determining a constraint determination value, performing operation control for the machine apparatus based on the constraint determination value obtained by the determination of the constraint determination value, according to a relationship set for the constraint determination value and the operation control, and learning a reconfiguration of a relationship between the constraint determination value and the operation control when the constraint determination value changes due to the operation control.

According to still another aspect of the present invention, there is provided a machine control method controlling the operation of a machine apparatus that handles a controlled object, the method including performing measurement regarding a state of the controlled object, comparing a measurement result with a predetermined constraint condition, the measurement result being obtained by the performance of the measurement, and determining a constraint determination value, performing operation control for the machine apparatus based on the constraint determination value obtained by the determination of the constraint determination value, according to a relationship set for the constraint determination value and the operation control, and learning a reconfiguration of a relationship between the constraint determination value and the operation control when the constraint determination value changes due to the operation control.

Advantage of the Invention

According to the present invention, it is possible to control the operation of a machine apparatus that handles a controlled object so that the controlled object maintains the desired state.

DETAILED DESCRIPTION OF THE INVENTION

Hereinafter, an embodiment of the present invention will be described with reference to the drawings.

<1. Outline of Single Crystal Production>

Prior to explain the machine control device, the machine control program, and the machine control method according to the present embodiment, a single crystal production apparatus is briefly explained as an example of a machine apparatus controlled by the machine control device, the machine control program, and the machine control method. A single crystal production, performed using the single crystal production apparatus, is outlined also.

The following explanation includes the basic configuration of the single crystal production apparatus and the basic procedure of the single crystal production. The single crystal is produced using the advanced pedestal (AP) method for example. This method disposes a raw material at the bottom position in the vertical direction (hereinafter also referred to as "downside") and a seed crystal at the top position in the vertical direction (hereinafter also referred to as "upside"). A melting zone is formed between the raw material and the seed crystal, where a crystal is continuously grown from the melting zone to produce a single crystal.

(1-1) Basic Configuration of Single Crystal Production Apparatus

Figure 1:
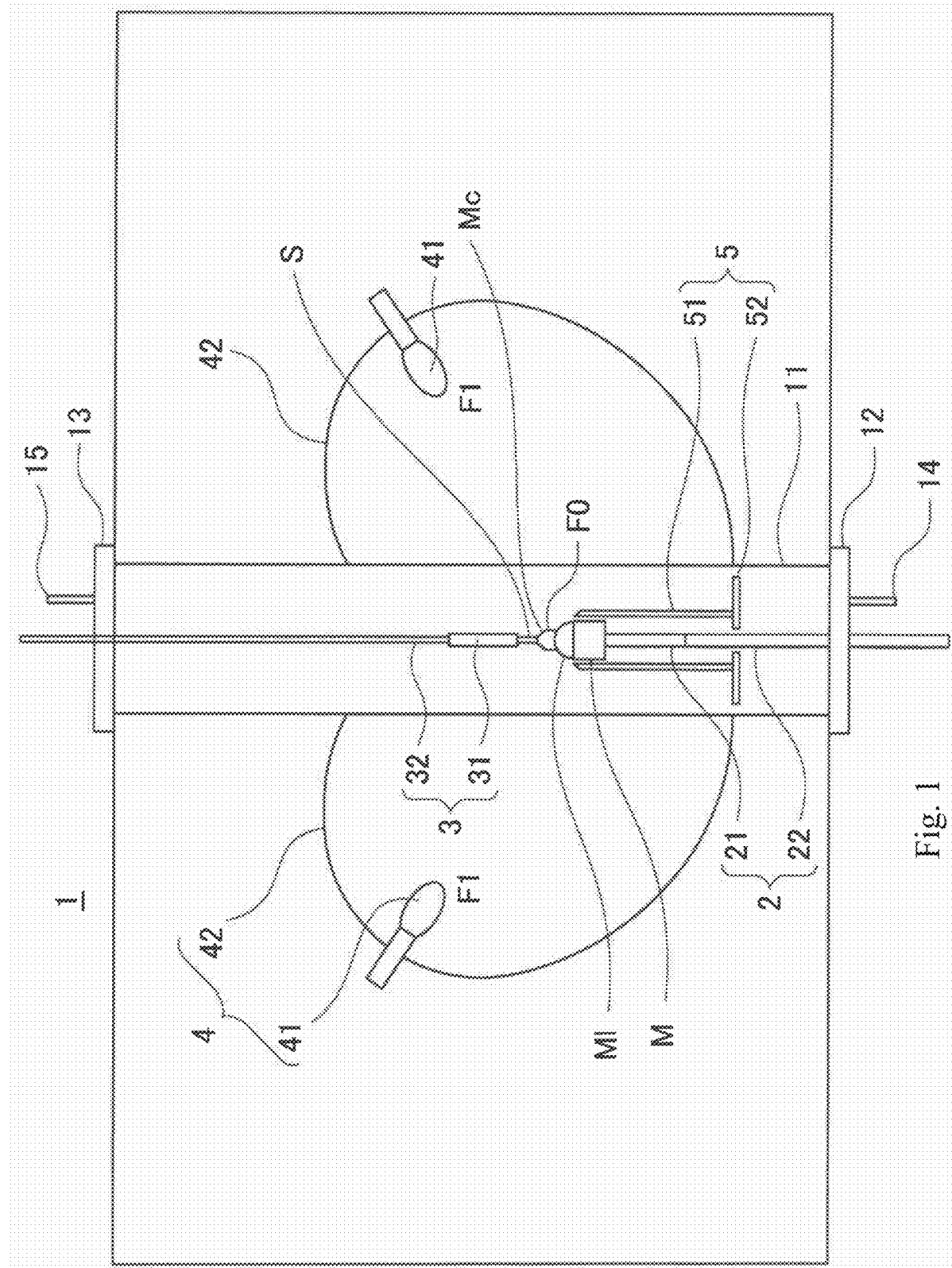
FIG. 1 is a schematic view showing an example of a schematic configuration of a single crystal production apparatus which is a machine apparatus according to the present embodiment.

FIG. 1 is a schematic view showing an example of a schematic configuration of a single crystal production apparatus according to the present embodiment.

(Overall Configuration)

The single crystal production apparatus 1 includes a raw material grip portion 2, a seed crystal grip portion 3, and heating parts 4 and 5 as the main components. These components 2 to 5 are configured to operate for growing a single crystal. Hereinafter, the components 2 to 5 will be described in order.

A crystal growth furnace for growing a single crystal is sealed by a quartz furnace tube 11 together with the lower shaft flange 12 and the upper shaft flange 13. This isolates a growth atmosphere in the furnace from the outside. The atmosphere of an appropriate composition is introduced into the furnace from the atmosphere introduction port 14, and the atmosphere is discharged from the atmosphere discharge port 15. This can properly maintain atmosphere components and pressure in the furnace.

(Raw Material Grip Portion)

The raw material grip portion 2 holds the raw material M necessary for the growth of a single crystal. This locates at the bottom position (lower side in the figure) facing the seed crystal grip portion 3 in accordance with the AP method.

As the raw material M, a pellet form is used for example. Therefore, the raw material grip portion 2 has the raw material holder 21 whose shape is engageable with the raw material M in a pellet form.

In addition, the raw material grip portion 2 is configured to be movable in the vertical direction and rotatable around an axis extending in the vertical direction. For that purpose, the raw material grip portion 2 has a lower shaft 22 extending downward from the raw material holder 21. The lower shaft 22 is connected to a drive source unshown in the drawings. The driving source performs a driving operation of the raw material grip portion 2 according to an instruction from a control unit described later.

(Seed Crystal Grip Portion)

The seed crystal grip portion 3 holds the seed crystal S necessary for the growth of a single crystal. This locates at the top position (upper side in the figure) facing the raw material grip portion 2 in accordance with the AP method.

As the seed crystal S, a rod form is used for example. Therefore, the seed crystal grip portion 3 has a seed crystal holder 31 whose shape is engageable with the seed crystal S in a rod form.

In addition, the seed crystal grip portion 3 is configured to be movable in the vertical direction and rotatable around an axis extending in the vertical direction. For that purpose, the seed crystal grip portion 3 has an upper shaft 32 extending upward from the seed crystal holder 31. The upper shaft 32 is connected to a drive source unshown in the drawings. The drive source performs a drive operation of the seed crystal grip portion 3 according to an instruction from a control unit described later.

(Heating Part)

The heating parts 4 and 5 perform a local heating on the raw material M held by the raw material grip portion 2 to melt the raw material M. The heating parts 4 and 5 are located to realize the local heating respectively.

Specifically, the heating part 4 includes an infrared lamp 41 for generating infrared rays and a rotary spheroidal mirror 42 attached thereto for the local heating. The infrared lamp 41 is positioned at one focal point F1 of the spheroidal mirror 42, and the raw material M held by the raw material grip portion 2 is positioned at the other focal point F0. This configuration allows the heating part 4 for the local heating on the raw material M by using the infrared rays generated by the infrared lamp 41 positioned obliquely above the raw material M. The lamp intensity (i.e., the infrared intensity) of the infrared lamp 41 is adjustable by instructed from a control unit described later.

In addition, another heating portion 5 includes a cylindrical shield 51 for the local heating. The cylindrical shield 51 surrounds the raw material M held by the raw material grip portion 2 and is movable in the vertical direction. This configuration allows the heating part 5 to irradiate only a predetermined portion of the raw material M with the infrared rays generated by the infrared lamp 41. This secures the local heating of the raw material M. For that purpose, the cylindrical shield 51 is fixed on the support floor 52 and is connected to a drive source unshown in the drawings through the support floor 52. The drive source performs a moving operation of the cylindrical shield 51 according to an instruction from a control unit described later.

Here both the heating parts 4 and 5 are mentioned for realizing the local heating as an example, but it does not necessarily need to have both them together. For example, only having the heating part 4 allows heating the raw material M.

Further, the heating part 4 is mentioned for realizing the local heating using the infrared lamp 41 and the spheroidal mirror 42 as an example here. The heating part 4 may use a laser instead of or in combination with the infrared lamp 41 for the local heating irradiation.

(1-2) Basic Procedure of Single Crystal Production

A basic procedure will be described for producing a single crystal using the single crystal production apparatus 1 having the above-described configuration. The single crystal production using the single crystal production apparatus 1 broadly consists of a preparation process, a heating process, and a single crystal growth process. Hereinafter, each of these processes will be described in order.

(Preparation Process)

For producing a single crystal, the raw material grip portion 2 located at the lower side holds the raw material M, and the seed crystal grip portion 3 located at the upper side holds the seed crystal S. Thereby, the raw material M and the seed crystal S are disposed facing each other. Then, the raw material grip portion 2 and the seed crystal grip portion 3 respectively move along the vertical direction. Thereby the raw material M held by the raw material grip portion 2 and the seed crystal S held by the seed crystal grip portion 3 may get close each other.

(Heating Process)

As the raw material M and the seed crystal S face close each other, the raw material grip portion 2 and the seed crystal grip portion 3 are rotated in circumferential direction in the reverse phase respectively. Using infrared rays generated by the infrared lamp 41, the raw material M is irradiated the infrared rays directly and converged by reflected by the spheroidal mirror 42 located obliquely above side of the close facing position. At the same time, the cylindrical shield 51 is arranged at an appropriate position. As a result, the portion of the raw material M held by the raw material grip portion 2 facing the seed crystal S is locally heated, so that the upper side of the raw material M melts. Then, by bringing the partially molten seed crystal S into contact with the molten portion, the melting zone Ml is formed between the raw material M and the seed crystal S.

(Single Crystal Growth Process)

After the melting zone Ml is formed, a single crystal is grown from melting zone Ml. Specifically, by raising the seed crystal grip portion 3, the melting zone Ml is pulled up, and the upper side portion (growth portion Mc) of the melting zone Ml is left from the infrared radiation region. As a result, the temperature decrease makes the growth portion Mc cooler to grow as a single crystal Mc.

At the same time, in order to grow single crystal Mc continuously from the melting zone Ml, it is necessary to form additional melting zone Ml. Therefore, the raw material grip portion 2 is also raised continuously to move the raw material M into the infrared irradiation region. By pulling up the raw material grip portion 2 and the seed crystal grip portion 3, the single crystal Mc can be continuously grown from the melting zone Ml, wherein their rising speeds are appropriately adjusted individually.

Such a procedure as described above makes possible to produce a large diameter single crystal in the single crystal production apparatus 1. Then, when a predetermined amount of single crystal is grown, the single crystal production is ended by performing an appropriate operation as necessary.

The basic configuration of the single crystal production apparatus 1 and the basic procedure of single crystal production described above may follow, for the content without described specifically, the known art of the configurations, procedures, etc. regarding single crystal production by the melting zone method as appropriate (for example, the contents described in Japanese Patent Application Laid-Open Publication No. 2015-081217, Japanese Patent Application Laid-Open Publication No. 2015-081218, and Japanese Patent Publication No. 5926432).

2. Knowledge Obtained by the Inventor

The production of a single crystal using the above-described procedure makes the single crystal Mc grown continuously from the melting zone Ml. It is necessary to maintain the state in which the melt continues forming the melting zone Ml to grow without a collapse.

However, it is not very easy for an operator of the single crystal production apparatus 1 to maintain the melting zone Ml in a specific state. It is affected by various factors such as a machine difference of single crystal production apparatuses 1, difference of raw materials M, eccentricity between the raw material M held by the raw material grip portion 2 and the seed crystal S held by the seed crystal grip portion 3, physical properties inside the melting zone Ml (viscosity of the melt, etc.), etc. Also the crystal growth may extend over a long time (for example, several tens of hours).

In this regard, it may use, for example, a known automatic control technique for the single crystal production apparatus 1. Specifically, it may control the operation of each of the components 2 to 5 in the single crystal production apparatus 1 based on a detection result of the state of melting zone Ml, wherein the state of melting zone Ml handled by the single crystal production apparatus 1 matches the predetermined target state.

However, with regard to the melting zone Ml handled by the single crystal production apparatus 1, it is substantially difficult to accurately realize its behavior or precisely control the state of its shape for the reasons described below.

The shape of melting zone Ml may possibly differ depending on operations of the single crystal production apparatus 1. It is due to the influence such as a machine difference of single crystal production apparatuses 1, difference of raw materials M, eccentricity between the raw material M held by the raw material grip portion 2 and the seed crystal S held by the seed crystal grip portion 3. Therefore, it is difficult to realize the behavior of the melting zone Ml in the single crystal production apparatus 1 accurately in advance.

Further, regarding the melting zone Ml, since its characteristics (temperature, viscosity, tension, etc. of the melt) may change over time, it is not very easy to regard the melting zone Ml as one physical model or to model it uniquely. Furthermore, characteristic fluctuation of the melting zone Ml may occur caused by various operations of the single crystal production apparatus 1. As an example, the expansion of the shape of the melting zone Ml may occur due to either the excess of the heating amount of the melt or the shortage of the heating amount of the melt. It may also be due to the behavior of the raw material grip portion 2 or the seed crystal grip portion 3. Therefore, it is not easy to obtain the control value for the operation control of each of the components 2 to 5 immediately from a fact that the shape of the melting zone Ml is expanded. It may also be difficult to model the melting zone Ml when the fluctuation of the state of the melting zone Ml does not uniquely correspond to the operating condition of the single crystal production apparatus 1.

Further, since each crystal growth in the melting zone Ml may extend over a long time (for example, several tens of hours), it will be unrealistic to configure a control model upon realizing a considerable amount of various phenomena by trying operation in the single crystal production apparatus 1 in advance. Moreover, since automatic control of the single crystal production apparatus 1 is required to be in real time. Some types of reinforcement learning are not suitable to be applied if the learning is performed searching the best actions.

That is, with regard to the melting zone Ml in the single crystal production apparatus 1, it is not easy to explicitly describe the melting zone Ml as one physical model. In this case, it is difficult to control so that the shape of the melting zone Ml follows the target shape.

In response to the above issue, the inventors of the present application has conducted extensive studies, and come to obtain a new knowledge of control, unlike the previous automatic control that makes the shape of the melting zone Ml follow the target shape. By defining a possible state in which the crystal growth in the melting zone Ml is continued as a predetermined state (hereinafter also referred to as a "predetermined shape state"), if the control prevents the shape of the melting zone Ml from deviating from the predetermined shape state, it may easily and reliably maintain the state in which the melting zone Ml keeps the formation. That is, even if it is difficult to define an ideal target value, it may easily define a limit value not to cause a failure. This implies that easy and reliable operation control may be possible if a control is performed so as not to deviate from the limit value.

Further knowledge has come from the continued extensive studies by inventors. In addition to controlling to prevent the shape of the melting zone Ml from deviating from the predetermined shape state, if reconfiguring a control model according to the control result, a learning effect will be exerted on the control content. This may make it possible with high accuracy to maintain the state in which the melting zone Ml keeps the formation. In other words, even if it is difficult to model the melting zone Ml uniquely and perform the operation control to achieve the target shape, if the control result is reflected in the new control content so as to exert the learning effect, it becomes possible to perform the operation control with the same accuracy as uniquely modeling.

The present embodiment is based on the above-described new knowledge found by the inventors of the present application.

3. Details of Control Configuration and Control Procedure

Based on the above-described knowledge, here is described in detail a machine control device and a machine control method according to an embodiment of the present embodiment. This is devised to perform the automatic control of the single crystal production apparatus 1 which is an example of the machine apparatus.

(3-1) Details of Control Configuration

Figure 2:
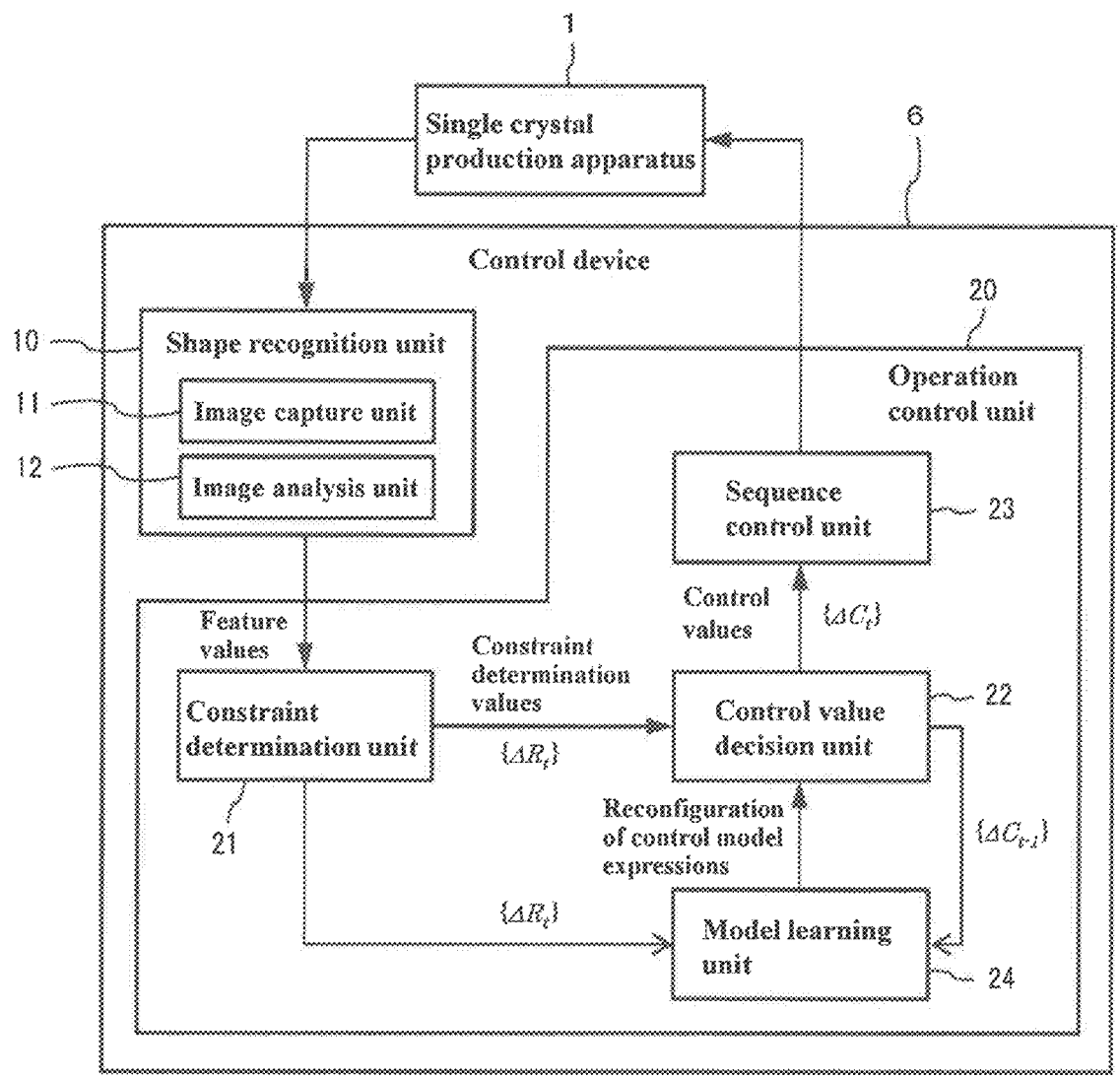
FIG. 2 is a block diagram showing an example of a functional configuration of a machine control device according to the present embodiment.

FIG. 2 is a block diagram showing an example of a functional configuration of the machine control device according to the present embodiment.

(Overall Configuration)

To perform the control processing based on the above-described knowledge, the single crystal production device 1 includes a machine control device (hereinafter, simply referred to as "control device") 6. The control device 6 may be mounted within the single crystal production apparatus 1 (that is, one integrated in the single crystal production apparatus 1), or connected via a wired or wireless communication line or the like to the single crystal production apparatus 1 (that is, one separate from the single crystal production apparatus 1).

The control device 6 is for controlling the operation of each of the components 2 to 5 in the single crystal production apparatus 1. It is configured to include hardware resources such as calculation unit composed of a combination of a central processing unit (CPU), a read only memory (ROM), a random access memory (RAM) and the like, storage unit such as flash memory or a hard disk drive (HDD), data input and output unit such as external interface, and image capture unit such as charge coupled device (CCD), complementary metal oxide semiconductor (CMOS). That is, the control device 6 is configured to include hardware resources as a computer device, in which the calculation unit executes the program stored in the storage unit. The program (software) and the hardware resource cooperatively control the operation of the single crystal production apparatus 1.

The control device 6 is broadly divided into a shape recognition unit 10 and an operation control unit 20. Hereinafter, these units 10 and 20 will be described in order.

(Shape Recognition Unit)

The shape recognition unit 10 functions as a specific example of the "measurement unit" in the present embodiment. It performs measurement regarding the state of the melting zone Ml in the single crystal production apparatus 1. More specifically, the shape recognition unit 10 acquires a captured image of the melting zone Ml (including images of the joint part between the melting zone Ml and the raw material M and the joint part between the melting zone Ml and the single crystal Mc). It recognizes the shape of the melting zone Ml from the captured image, and measures the feature values of the shape of the melting zone Ml. For that purpose, the shape recognition unit 10 is configured to include an image capture unit 11 and an image analysis unit 12.

(Image Capture Unit)

The image capture unit 11 in the shape recognition unit 10 is realized by a CCD sensor, a CMOS sensor, or the like, and acquires a captured image of the shape of the melting zone Ml. The captured image to be acquired may be a still image or a video image. In the following description, the image capture unit 11 is supposed to acquires a video as a captured image as an example.

The single crystal production apparatus 1 is for performing single crystal production using the AP method. Since the infrared lamp 41 is configured to irradiate with infrared rays from obliquely above side to perform local heating, the image capture unit 11 can be disposed on the lateral side of the melting zone Ml to acquire captured images of the melting zone Ml. This may minimize the complication of the apparatus configuration for acquiring a captured image of the melting zone Ml. This also makes easy and accurate to realize the shape recognition of the melting zone Ml by capturing images from the lateral side.

(Image Analysis Unit)

The image analysis unit 12 in the shape recognition unit 10 is realized by executing a predetermined program. The calculation unit executes the program to analyze the captured image acquired by the image capture unit 11 and extract feature values of the shape of the melting zone Ml. The feature values are to specify a characteristic shape part of the melting zone Ml, and specifically, it is conceivable to use the dimension values of the characteristic shape part as an example thereof. What kind of feature values are to be extracted is supposed to be set in advance. The number of extracted values may be single or plural as long as it is set in advance.

Figure 3:
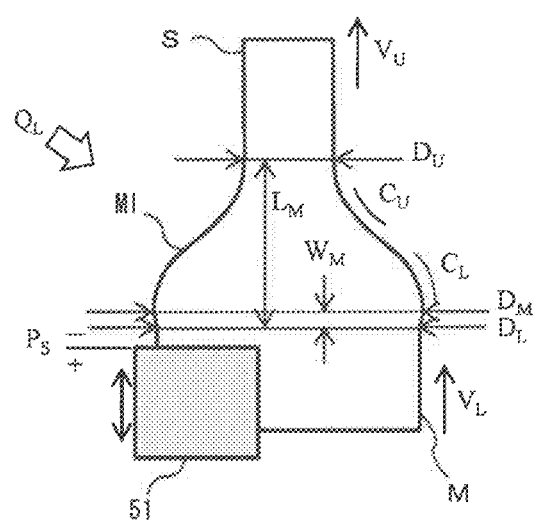
FIG. 3 is an explanatory view showing one specific example of a shape of a melting zone which is a controlled object by a machine control device according to the present embodiment.

FIG. 3 is an explanatory view showing one specific example of the shape of a melting zone which is a controlled object by the machine control device according to the present embodiment.

The figure illustrates as feature values of the shape of melting zone Ml, crystal diameter $D_U$ [mm], raw material side abnormal diameter $D_M$ [mm], raw material diameter $D_L$ [mm], melting zone upper curvature $C_U$ [/mm], melting zone lower curvature $C_L$ [/mm], melting zone height $L_M$ [mm], and raw material side abnormal height $W_M$ [mm]. It is conceivable to extract at least one of or preferably all of these seven types of feature values Note that the feature values illustrated here are merely specific examples, and the feature values to be extracted are not limited to these.

Such feature value extraction may be performed using a known image processing technique. Specifically, after edge detection is performed on an image of one frame extracted from a captured image acquired by the image capture unit 11, feature values can be extracted if the dimension values of the characteristic shape portion are measured.

By the way, in single crystal production using the AP method, the raw material M and the seed crystal S are respectively rotated in reverse phases for stirring the melt and homogenizing the heated environment. In addition, the rotation axes of the raw material grip portion 2 and the seed crystal grip portion 3 for gripping each may also be eccentric.

In consideration of these matters, the image analysis unit 12 may extract feature values as follows. Specifically, the feature values are obtained from each sequence of a plurality of frame images synchronized with the rotation of the raw material grip portion 2 and the seed crystal grip portion 3 (for example, 48 divide images in a rotation). After applying smoothing processing to remove noise components and the like, the feature values to be extracted will be specified. That is, the image analysis unit 12 may recognize the shape of the melting zone Ml through processing smoothing on the plurality of captured images acquired for the melting zone Ml.

In this way, for example, even if the captured image acquired for the melting zone Ml may be affected by rotation, eccentricity, etc., after removing noise components and the like caused by these influences, the feature values of the shape of the melting zone Ml can be extracted. This makes it possible to improve the accuracy of feature value extraction.

(Operation Control Unit)

The operation control unit 20 in FIG. 2 controls each operation of the components 2 to 5 in the single crystal production apparatus 1 by sending operation instructions to each of them. Although an example illustrates all of the components 2 to 5 are controlled by the operation control unit 20, the operation control unit 20 may control operation for at least one of the components 2 to 5.

The operation control unit 20 uses the shape recognition result of the melting zone Ml in the shape recognizing unit 10, and performs operation control of the respective components 2 to 5 so as to prevent the shape of the melting zone Ml from deviating from the predetermined shape state. The predetermined shape state here will be described in detail later.

The operation control unit 20 is realized by executing a predetermined program by the calculation unit to perform such operation control. This realizes each function of the constraint determination unit 21, the control value decision unit 22, the sequence control unit 23, and the model learning unit 24. Hereinafter, these units 21 to 24 will be described in order.

(Constraint Determination Unit)

The constraint determination unit 21 functions as a specific example of the "determination unit" of the present embodiment. It obtains the constraint determination values by comparing the measurement result by the shape recognition unit 10 with a predetermined constraint condition. More specifically, the constraint determination unit 21 compares the feature values obtained by the image analysis unit 12 in the shape recognition unit 10 with the limit values set for each of the feature values. Then it obtains each of the proximity of the feature value to its limit value as the constraint determination value ΔR. That is, the constraint determination unit 21 uses, as a predetermined constraint condition, the limit values set for the feature values of the melting zone Ml which is the measurement result by the shape recognition unit 10. This may determines each of the proximity to the limit value as the constraint determination value ΔR.

The limit values mentioned here are individually set for each of the feature values. Specific example may specify an upper limit value or a lower limit value as allowable value for a dimension value defined as a feature value. Therefore, a limit value may be set to a plurality of types (for example, both the upper limit value and the lower limit value) for one type of feature value. A state in the shape specified by such limit values corresponds to the above-mentioned predetermined shape state. That is, the limit value is a value corresponding to the boundary condition required for the melting zone Ml to maintain the predetermined shape state. Therefore, by comparing the feature values and the limit values, the melting zone Ml is controlled to prevent the dimension values (that is, the feature values) of the characteristic shape part from deviating from the limit value. Thus, the shape state is maintained in which the melt will not collapse or break.

The proximity of the feature value to the limit value specifies a proximity to the limit value quantitatively (that is, the degree of severity of the proximity). It can be calculated by a predetermined calculation equation. The calculation equation may specify linear change of proximity or nonlinearly increase as the limit value approaches.

(Control Value Decision Unit)

The control value decision unit 22 is a specific example corresponding to a part of the "control unit" in the present embodiment. It determines the control values ΔC for controlling the operation of each of the components 2 to 5 in the single crystal production apparatus 1, based on the constraint determination values ΔR obtained by the constraint determination unit 21, according to the control model expressions which define the relationships between the constraint determination values ΔR and the control values ΔC.

The control value ΔC corresponds to a control variable (control parameter) for specifying the operation content in each of the components 2 to 5. Specifically, for example, the control value ΔC determined by the control value decision unit 22 may use at least one of or preferably all of these four types of variation, the lamp output $Q_L$ [%] of the infrared lamp 41, the vertical position $P_S$ [mm] of the cylindrical shield 51, the vertical movement velocity $V_L$ [mm/h] of the raw material grip portion 2, and the vertical movement velocity $V_U$ [mm/h] of the seed crystal grip portion 3 (See FIG. 3). Note that the control values ΔC illustrated here are merely specific examples, and the control values ΔC to be determined are not limited to these.

Control model expressions $\Delta C^j = F_j(\Delta R^1, \Delta R^2, \ldots, \Delta R^i)$ (where i is the number of types of constraint determination values ΔR, j is up to the number of types of control values ΔC, and F is a function of ΔR and ΔC) determine the control values ΔC. They are set in advance but will be reconfigured. The detail of the control model expressions and the reconfiguration will be described later.

(Sequence Control Unit)

The sequence control unit 23 is a specific example corresponding to another part of the "control unit" in the present embodiment. It performs the operation control of each of the components 2 to 5 in the single crystal production apparatus 1, based on the control values ΔC determined by the control value decision unit 22. That is, the sequence control unit 23 provides an operation instruction to each of the components 2 to 5 in the single crystal production apparatus 1, thereby each of the components 2 to 5 operates according to the control values ΔC determined by the control value decision unit 22.

(Model Learning Unit)

The model learning unit 24 is a specific example of the "learning unit" of the present embodiment. It reconfigures a relationship between the constraint determination values ΔR and the operation control performed by the sequence control unit 23, when the constraint determination value ΔR changes due to the operation control performed by the sequence control unit 23. More specifically, the model learning unit 24 performs reconfiguration of the control model expressions $\Delta C^j = F_j(\Delta R^1, \Delta R^2, \ldots, \Delta R^i)$ used by the control value decision unit 22, according to how the constraint determination value ΔR determined by the constraint determination unit 21 changes due to the operation control performed by the sequence control unit 23.

The reconfiguration is to update the settings of the control model expressions so as to optimize the result of the operation control. For example, the updating items (for example, a weighting variable described later) constituting the control model expressions are updated as needed. The details of the reconfiguration will be described later.

That is, the model learning unit 24 reconfigures the control model expressions according to the result of the operation control performed periodically iterated as a cyclic processing. The learning is performed to make the result of the operation control reflect in the content of subsequent operation controls. This will make it possible to optimize the result as repeating the operation control.

(Program)

The control device 6 configured as described above executes a predetermined program by the calculation unit. This realize the function of the image analysis unit 12 in the shape recognition unit 10, and the functions of the constraint determination unit 21, the control value decision unit 22, the sequence control unit 23, and the model learning unit 24 in the operation control unit 20. That is, the predetermined program realizes each function in the shape recognition unit 10 and the operation control unit 20 and corresponds to one embodiment of the "machine control program" according to the present embodiment.

If the predetermined program for realizing each function are possible to be installed in the control device 6 as a computer device, it may be provided by storing in a recording medium readable by the computer device (for example, a magnetic disk, an optical disk, a magneto-optical disk, a semiconductor memory, etc.) or may be provided from the outside through a network such as the Internet or a dedicated line.

(3-2) Details of Control Procedure

There will be described in detail the procedure of the control process performed by the control device 6 having the configuration described above. This is the procedure of the machine control method according to the present embodiment.

(Procedure of Control Processing)

Figure 4:
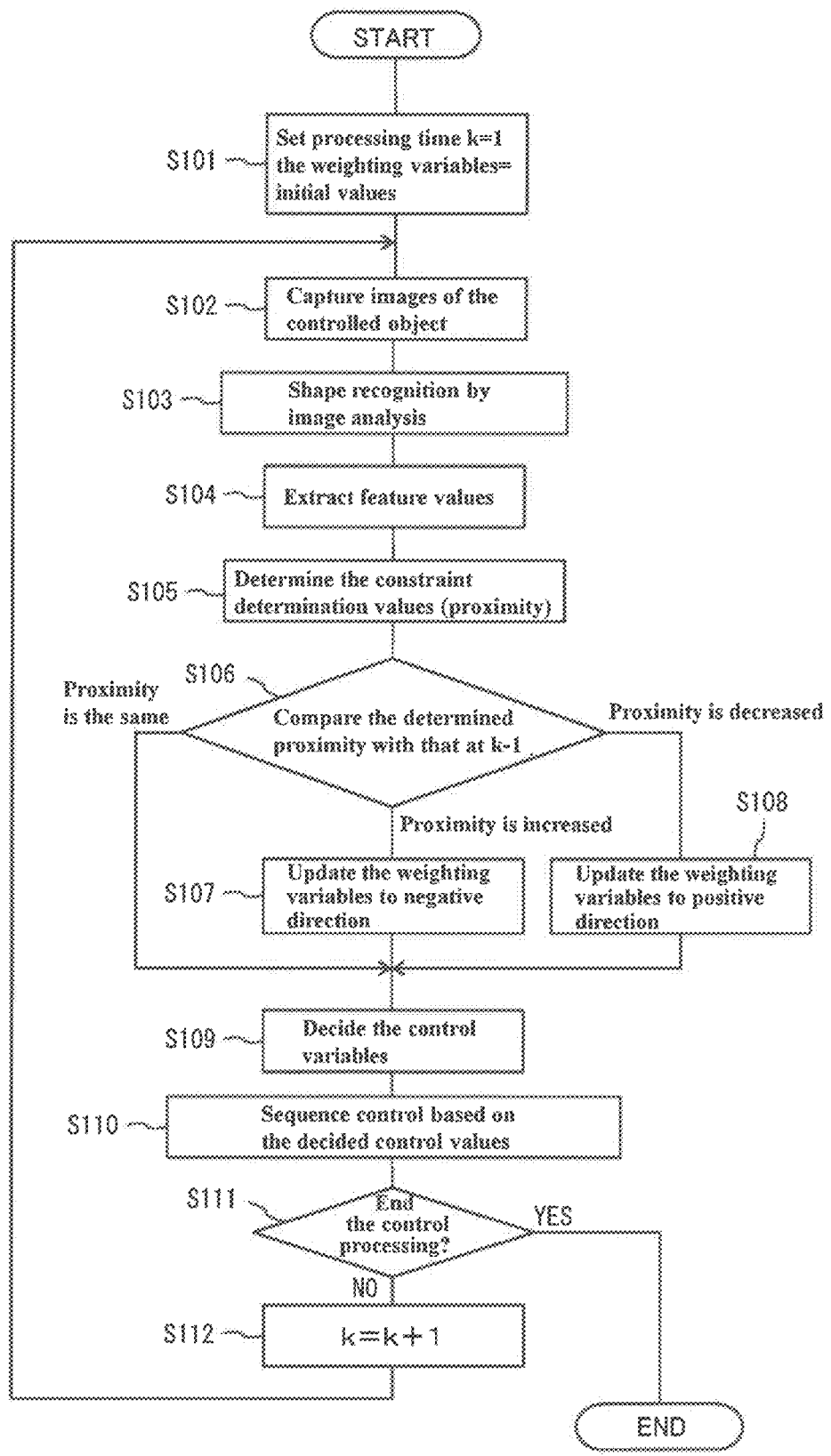
FIG. 4 is a flowchart showing an example of a procedure of a machine control method according to the present embodiment.

FIG. 4 is a flowchart showing an example of the procedure of the machine control method according to the present embodiment.

The production of a single crystal using the single crystal production apparatus 1 described above sequentially performs the preparation process, the heating process and the single crystal growth process. Then, in either the heating process or the single crystal growth process, the melting zone Ml is formed between the raw material M and the seed crystal S. When the melting zone Ml is in a stable state, the control process by the controller 6 will start. Although the start trigger of control processing is not specifically limited, it may be triggered by predetermined operation by the operator of the single crystal production apparatus 1 or the control device 6 as a specific example.

The control processing in the control device 6 firstly initializes the condition settings for the control processing (step 101, hereinafter, the step is abbreviated as "S"). Specifically, the processing time k of the control process is set to k=1, and the setting of the control model expressions used by the control value decision unit 22 is set to the initial state. More specifically, the updating items (for example, weighting variables described later) in the control model expressions are set to initial values. Note that the initial values are not limited to specific values and for example, may be based on knowledge in advance or set all "1" as long as it is appropriately set according to the contents of the control model expressions.

When the condition setting is initialized, the image capture unit 11 obtains a captured image of the shape of the melting zone Ml as the controlled object (S102). When the image capture unit 11 obtains captured images corresponding to one rotation of the raw material grip portion 2 and the seed crystal grip portion 3, the image analysis unit 12 analyzes the captured images (S103) to extract the feature values of the shape of the melting zone Ml (S104). Specifically, the image analysis unit 12 takes a plurality of frame images from the captured image of one rotation (for example, 48 divide images in a rotation) and performs edge detection and the like on each frame image to obtain the feature values. Smoothing processing is applied on the feature values obtained from each frame image to remove noise components and the like, thereby the feature values to be extracted are specified. Thus, the image analysis unit 12 extracts the feature values of the shape of the melting zone Ml.

After extracting the feature values, the constraint determination unit 21 compares the feature values obtained by the image analysis unit 12 with the limit value set for the feature value, and determines a proximity to the limit value of the feature value as the constraint determination value ΔR (S105). When multiple types of feature values are extracted, the constraint determination unit 21 obtains the constraint determination value ΔR for each of the feature values. In addition, when a plurality of limit values are set for one type of the feature value, the constraint determination unit 21 obtains the constraint determination values ΔR for each limit value.

Once the constraint determination values ΔR are obtained, here, the model learning unit 24 compares the constraint determination values ΔR with the constraint determination values ΔR obtained by the constraint determination unit 21 at the processing time k−1 and determines how each constraint determination value ΔR varies between the processing time k and the processing time k−1 (S106). More specifically, the model learning unit 24 determines whether the constraint determination value ΔR fluctuates as the feature value approaches the limit value and the proximity increases, the constraint determination value ΔR fluctuates as the feature value separates from the limit value and the proximity decreases, or the proximity remains the same. Note that when the initial processing time k=1, such determination processing may be omitted due to no comparison target yet.

As a result, if the proximity is increased, for the control model expression $\Delta C^j = F_j(\Delta R^1, \Delta R^2, \ldots, \Delta R^i)$ in which the control value $\Delta C^j$ (that is, the variation of the control parameter) determined at the previous processing time k−1 was a positive value among the control model expressions $\Delta C^j = F_j(\Delta R^1, \Delta R^2, \ldots, \Delta R^i)$ used by the control value decision unit 22, the model learning unit 24 update the updating items relating to the control model expression and regarding the types of the constraint determination values ΔR whose proximity is increased (specifically, for example, a weighting variable regarding the constraint determination value ΔR) to negative direction (direction to alleviate the increase in proximity) (S107).

Further, if the proximity is decreased, for the control model expression $\Delta C^j = F_j(\Delta R^1, \Delta R^2, \ldots, \Delta R^i)$ in which the control value $\Delta C^j$ (that is, the variation of the control parameter) determined at the previous processing time k−1 was a positive value among the control model expressions $\Delta C^j = F_j(\Delta R^1, \Delta R^2, \ldots, \Delta R^i)$ used by the control value decision unit 22, the model learning unit 24 update the updating items relating to the control model expression and regarding the types of the constraint determination values ΔR whose the proximity is decreased (specifically, for example, a weighting variable regarding the constraint determination value ΔR) to positive direction (direction to promote the decrease in proximity) (S108).

Further, if the proximity is the same, the model learning unit 24 does not reconfigure the control model expression $\Delta C^j = F_j(\Delta R^1, \Delta R^2, \ldots, \Delta R^i)$ used by the control value decision unit 22.

The details of the updating items (weighting variables etc.) in the control model expressions and the specific manner of the update will be described later.

After the above determination and update, the control value decision unit 22 uses the updated control model expressions $\Delta C^j = F_j(\Delta R^1, \Delta R^2, \ldots, \Delta R^i)$ and determines the control values ΔC for controlling the operation of each of the components 2 to 5 in the single crystal production apparatus 1, based on the constraint determination values ΔR determined by the constraint determination unit 21 (S109). The specific manner of the control model expressions is described in detail later.

Then, after determining the control values ΔC, the sequence control unit 23 instructs each of the components 2 to 5 in the single crystal production apparatus 1 so that the components 2 to 5 operate according to the control values ΔC (S110). Thereby, in the single crystal production apparatus 1, the operations of the respective components 2 to 5 will be controlled to prevent the shape of the melting zone Ml formed between the raw material M and the seed crystal S from deviating from the predetermined shape state.

Thereafter, the control device 6 determines whether to end the series of the above-mentioned control processes (S111). Although this judgment is not particularly limited, it may be decided based on a predetermined operation by the operator of the single crystal production apparatus 1 or the control device 6 for example.

Then, when the control process is not ended, the control device 6 increments the processing time k of the control process to k+1 (S112), and repeats the series of the above-mentioned control processes (S102 to S102) from acquisition of captured images (S102). That is, the image capture unit 11 and the image analysis unit 12 in the shape recognition unit 10, and the constraint determination unit 21, the control value decision unit 22, the sequence control unit 23, and the model learning unit 24 in the operation control unit 20 configuring the control device 6 perform the series of the above-mentioned control processes (S102 to S112) as cyclic processing that periodically iterated.

The cyclic processing is supposed to have its cycle set such that processing of one cycle is completed within a prescribed time. The prescribed time here is a time determined according to the operation specification of each of the components 2 to 5 in the single crystal production apparatus 1, specifically, a time that makes it possible to carry out the operation control for each of the components 2 to 5 in real time, in parallel with the production of a single crystal, that is, for example, a time set to 500 m seconds to several seconds. That is, one processing cycle is completed within a prescribed time for the series of control processes (S102 to S112) performed by the respective units 11 to 24 in the control device 6.

By performing processing in such a cycle, each of the units 11 to 24 in the control device 6 performs the operation control for each of the components 2 to 5 in the single crystal production apparatus 1, in parallel with the single crystal production using the melting zone Ml in the single crystal production apparatus 1. That is, the single crystal production apparatus 1 may perform the operation control for each of the components 2 to 5 in real time, in parallel with the single crystal production, following the movement of the melting zone Ml necessary for the single crystal production.

The prescribed time regarding cyclic processing may be set based on the time constant regarding the melting zone Ml as the controlled object and the single crystal production apparatus 1 which handles the melting zone Ml.

The time constant mentioned here is the time required for the shape of the melting zone Ml to become stable after changing the operation state of each of the components 2 to 5 in the single crystal production apparatus 1, and can be determined based on the empirical rules, the experimental results, etc.

When setting the cycle based on the time constant, the period of cyclic processing is set to fit the time series in which operation control is performed after waiting for the time constant to elapse. In this way, since the process waits until the shape of melting zone Ml is stabilized, the accuracy of the operation control can be improved while securing the real time feature of the operation control.

(Details of Control Model Expressions)

The control model expressions used in the series of control processes described above will be described in more detail, giving a specific example.

For example, it is considered to extract all the seven types of feature values described above for the shape of the melting zone Ml. Each of these feature values is compared with a preset limit value. Then, the proximity to the limit value is determined as the constraint determination value ΔR. At this time, a plurality of types of limit values (for example, both upper limit value and lower limit value) may be set for one type of feature value. Therefore, i types of $\Delta R^1, \Delta R^2, \ldots, \Delta R^i$ (i is a natural number equal to or more than the number of types of feature values (for example, 7 types)) are determined as the constraint determination values ΔR.

The constraint determination values ΔR may be calculated based on preset arithmetic equations. Specifically, taking the melting zone lower curvature $C_L$ [/mm] as a feature value example, the constraint determination value $\Delta RC_{LU}$ in the case where this is compared with the upper limit value may be calculated by the following equation (1). In equation (1), R is the reference value of the boundary approach rate (which measures the critical severity), $C_{LU}$ is the melting zone lower curvature upper limit [/mm], and $C_{LL}$ is the melting zone lower curvature lower limit [/mm].

[Equation 1]

$$\Delta RC_{LU} = \frac{R - \frac{C_{LU} - C_L}{C_{LU} - C_{LL}}}{R} \quad (1)$$

The other type of constraint determination value ΔR may also be calculated based on an arithmetic equation similar to the above-mentioned equation (1). By performing such calculation processing for each feature value and each limit value, it is possible to obtain i types of constraint determination values $\Delta R^1, \Delta R^2, \ldots, \Delta R^i$.

After determining the constraint determination values $\Delta R^1, \Delta R^2, \ldots, \Delta R^i$, the control values ΔC are determined using control model expressions based on these constraint determination values $\Delta R^1, \Delta R^2, \ldots, \Delta R^i$. As the control values ΔC, it may be considered to determine the four types (see FIG. 3) described above for example.

That is, j types (j is a natural number) of $\Delta C^1, \Delta C^2, \ldots, \Delta C^j$ may exist as the control values ΔC. Therefore, for the control model expressions that determine these ΔC, $\Delta C^1 = F_1(\Delta R^1, \Delta R^2, \ldots, \Delta R^i)$, $\Delta C^2 = F_2(\Delta R^1, \Delta R^2, \ldots, \Delta R^i)$, ..., $\Delta C^j = F_j(\Delta R^1, \Delta R^2, \ldots, \Delta R^i)$ are individually set corresponding to the respective control values $\Delta C^1, \Delta C^2, \ldots, \Delta C^j$.

Specifically, as the control model expression $\Delta C^j = F_j(\Delta R^1, \Delta R^2, \ldots, \Delta R^i)$ for determining the j-th control value $\Delta C^j$, the following equations (2) to (4) can be exemplified.

The following equation (2) obtains a control value $\Delta C^j_P$ for changing the operation target controlled by the control value $\Delta C^j$ in the direction to increase (e.g., the output increase direction to raise the temperature in the case of the lamp output $Q_L$) and a control value $\Delta C^j_N$ for changing the operation target controlled by the control value $\Delta C^j$ in the direction to decrease (e.g., the output decrease direction to decrease the temperature in the case of the lamp output QL) separately and independently, and then determines the control value $\Delta C_j$ by combining the control values $\Delta C^j_P$ and $\Delta C^j_N$. Thus, the control value $\Delta C^j$ is calculated divided into each of the increasing and decreasing direction in case there is no linearity in each direction. That is, if the control values $\Delta C^j_P$ and $\Delta C^j_N$ obtained by decomposing in each direction are combined to obtain the control value $\Delta C^j$, it becomes possible to determine the control value $\Delta C^j$ with high accuracy regardless of the presence or absence of linearity in each direction (that is, in case no linearity).

$$\Delta C^j = \Delta C^j_P - \Delta C^j_N \quad (2)$$

[Equation 2]

In the above equation (2), the control value $\Delta C^j_P$ that causes the operation target controlled by the control value $\Delta C^j$ to change in the increasing direction is specified by the following equation (3). In the equation (3), $\alpha_{11}, \alpha_{12}, \ldots, \alpha_{1i}$ are weighting variables individually corresponding to each of the i types of the constraint determination values $\Delta R^1, \Delta R^2, \ldots, \Delta R^i$.

[Equation 3]

$$\Delta C^j_P = \ln \frac{\alpha_{11} e^{\Delta R^1} + \alpha_{12} e^{\Delta R^2} + \ldots + \alpha_{1(i-1)} e^{\Delta R^{(i-1)}} + \alpha_{1i} e^{\Delta R^i}}{\alpha_{11} + \alpha_{12} + \ldots + \alpha_{1(i-1)} + \alpha_{1i}} \quad (3)$$

Further, in the above equation (2), the control value $\Delta C^j_N$ that causes the operation target controlled by the control value $\Delta C^j$ to change in the decreasing direction is specified by the following equation (4). In the equation (4), $\alpha_{11}, \alpha_{22}, \ldots, \alpha_{2i}$ are weighting variables individually corresponding to the respective i types of the constraint determination values $\Delta R^1, \Delta R^2, \ldots, \Delta R^i$.

[Equation 4]

$$\Delta C^j_N = \ln \frac{\alpha_{21} e^{\Delta R^1} + \alpha_{22} e^{\Delta R^2} + \ldots + \alpha_{2(i-1)} e^{\Delta R^{(i-1)}} + \alpha_{2i} e^{\Delta R^i}}{\alpha_{21} + \alpha_{22} + \ldots + \alpha_{2(i-1)} + \alpha_{2i}} \quad (4)$$

As apparent from the above equations (2) to (4), the control model expression $\Delta C^j = F_j(\Delta R^1, \Delta R^2, \ldots, \Delta R^i)$ for determining the j-th control values $\Delta C^j$ include equations for calculating the control values $\Delta C^j_P$ and $\Delta C^j_N$ using the weighted average of the i types (ie, plural types) of the constraint determination values $\Delta R^1, \Delta R^2, \ldots, \Delta R^i$. Thus, by using equations utilizing weighted averages, in the control model expressions $\Delta C^j = F_j(\Delta R^1, \Delta R^2, \ldots, \Delta R^i)$, each constraint determination values $\Delta R^1, \Delta R^2, \ldots, \Delta R^i$ can be properly reflected in the calculation result of the control values ΔCj.

More specifically, the equations (3) and (4) included in the control model expressions $\Delta C^j = F_j(\Delta R^1, \Delta R^2, \ldots, \Delta R^i)$ are equations to take weighted averages in the exponential space and then return to linear space by taking logarithms. Thus, by utilizing the weighted averages in the exponential space, it is possible to expect improvement in calculation accuracy of the control values ΔCj.

Although a specific example is given here for the control model expression $\Delta C^j = F_j(\Delta R^1, \Delta R^2, \ldots, \Delta R^i)$ for determining the j-th control value ΔCj, other types of control values $\Delta C^1, \Delta C^2, \ldots, \Delta C^{j-1}$ may be considered to use control model expressions set in the same manner as in the case of the control value $\Delta C^j$. By using such control model expressions, each of j kinds of the control values $\Delta C^1, \Delta C^2, \ldots, \Delta C^j$ can be determined individually.

The control values $\Delta C^1, \Delta C^2, \ldots, \Delta C^j$ determined in this manner are for controlling to prevent each feature value in the shape of the melting zone Ml from deviating from the limit value set for each. Therefore, if performing operation control using such control values $\Delta C^1, \Delta C^2, \ldots, \Delta C^j$ even if it is difficult to define an ideal target value for each feature value, it is possible not to deviate from the limit value which causes the collapse of the shape of the melting zone Ml. That is, it becomes possible to easily and reliably maintain the predetermined shape state of the melting zone Ml (that is, the state in which the crystal growth can be continued) by the operation control to prevent each feature value from deviating from the limit value.

(Reconfiguration of Control Model Expressions)

As described above, the control model expressions are reconfigured (update of the updating items) by the model learning unit 24 according to how the constraint determination values $\Delta R$ determined by the constraint determination unit 21 change due to the operation control performed by the sequence control unit 23.

Here, the reconfiguration of the control model expressions will be described in more detail, giving a specific example. The reconfiguration is performed for either of the above-described equation (3) or equation (4) will be described as an example.

For example, it is considered that the proximity to the limit value is varied to increase between the processing time k and the processing time k–1 for the constraint determination value $\Delta R^1$. In such a case, since the proximity of the constraint determination value $\Delta R^1$ is increased, the reconfiguration is performed in the negative direction so that the proximity increase is alleviated.

Specifically, in order to reduce the influence of the constraint determination value $\Delta R^1$ in which the proximity has increased in (3) or (4) whose value determined at the processing time k–1 becomes a positive value, the weighting variable $\alpha_{11}$ or the weighting variable $\alpha_{11}$ is updated so that the weight of the weighting variable $\alpha_{11}$ or the weighting variable $\alpha_{11}$ regarding the constraint determination value $\Delta R^1$ decreases.

At this time, regarding how much the weighting variable $\alpha_{11}$ or the weighting variable $\alpha_{21}$ which is the updating item to be changed, it is assumed that the amount of change is determined in advance. As long as it is predetermined, the amount of change may be fixed, which is uniformly determined, or may be variable which is determined according to the proximity. When it is variable, if an arithmetic equation that defines the relationship with the proximity is set, the amount of change can be determined by using the arithmetic equation.

Also, conversely, for example, when the proximity to the limit value is varied to decrease for the constraint determination value $\Delta R^1$, the reconfiguration is performed in the positive direction so that the proximity decrease is promoted.

Specifically, in order to increase the influence of the constraint determination value $\Delta R^1$ in which the proximity has decreased in (3) or (4) whose value determined at the processing time k–1 becomes a positive value, the weighting variable $\alpha_{11}$ or the weighting variable $\alpha_{21}$ is updated so that the weight of the weighting variable $\alpha_{11}$ or the weighting variable $\alpha_{21}$ regarding the constraint determination value $\Delta R^1$ increases.

Also in this case, it is assumed that the amount of change of the weighting variable $\alpha_{11}$ or the weighting variable $\alpha_{21}$ which is the updating item is determined in advance, as in the case described above.

Further, for example, when the proximity to the limit value is the same without any change for the constraint determination value $\Delta R^1$, the update with respect to the weighting variables $\alpha_{11}$ and $\alpha_{21}$ is not performed.

Such an update process will be performed one of or both each of the weighting variables $\alpha_{11}$, $\alpha_{11}$, ..., $\alpha_{1i}$ in the equation (3) and each of the weighting variables $\alpha_{21}$, $\alpha_{22}$, ..., $\alpha_{2i}$, in the equation (4). Thus, the control model expressions $\Delta C^j = F_j(\Delta R^1, \Delta R^2, \ldots, \Delta R^i)$ including the equations (3) and (4) and configured to synthesize these by equation (2) is reconfigured as appropriate depending on how the constraint determination values $\Delta R$ fluctuate.

That is, the model learning unit 24 performs the reconfiguration for the control model expressions $\Delta C^j = F_j(\Delta R^1, \Delta R^2, \ldots, \Delta R^i)$ by updating the weighting variables in the weighted averages regarding the constraint determination values $\Delta R$ which have changed.

If the above reconfiguration is periodically repeated in a predetermined cycle, the control model expressions $\Delta C^j = F_j(\Delta R^1, \Delta R^2, \ldots, \Delta R^i)$ may change so that the fluctuation of the constraint determination values $\Delta R$ converges. That is, by performing the reconfiguration of the control model expressions $\Delta C^j = F_j(\Delta R^1, \Delta R^2, \ldots, \Delta R^i)$ according to the control result where the control is performed to prevent the shape of melting zone Ml from deviating from the predetermined shape state, the learning effect is exerted on the contents of the control, whereby as a result, the state in which the melting zone Ml is formed (that is, the state in which no collapse, breakage or the like does not occur) can be maintained with high accuracy.

Thus, by changing the control model expressions $\Delta C^j = F_j(\Delta R^1, \Delta R^2, \ldots, \Delta R^i)$ by periodical reconfiguration, appropriate operation control can be performed while flexibly coping even with the machine difference of the single crystal production apparatus 1, the difference of the raw material M, the operation difference of the raw material grip portion 2, the seed crystal grip portion 3 etc., or the like, for example. In other words, even if it is difficult to model the melting zone Ml uniquely and perform operation control to keep the target shape, by reflecting the control result in the new control content so as to exert the learning effect, the operation control can be performed with the same accuracy as the modeling. Moreover, if cyclic processing is performed in a period set based on the time constant regarding the melting zone Ml etc., even when the reconfiguration of the control model expressions $\Delta C^j = F_j(\Delta R^1, \Delta R^2, \ldots, \Delta R^i)$ is performed, it becomes possible to perform the operation control on the melting zone Ml as well as following the real-time movement of the melting zone Ml and the like.

4. Advantage of the Embodiment

The present embodiment may exhibit one or more effects as follows.

(A) In the present embodiment, after obtaining the feature values for the melting zone Ml which is the controlled object, the proximity of the feature values to the limit values is determined as the constraint determination values $\Delta R$. The control value $\Delta C$ for controlling the operation of each of the components 2 to 5 in the single crystal production apparatus 1 is determined based on the constraint determination values $\Delta R$ using control model expressions $\Delta C^j = F_j(\Delta R^1, \Delta R^2, \ldots, \Delta R^i)$. Therefore, according to the present embodiment, even if it is difficult to define an ideal target value for the feature value of the shape of melting zone Ml, by performing the operation control to prevent the feature values from deviating from the limit values, it is possible to easily and reliably maintain the melting zone Ml in a state where it does not cause collapse, breakage or the like (that is, a state in which the crystal growth can be continued).

Specifically, even if it is very difficult to accurately grasp the behavior of the melting zone Ml which is the controlled object, in advance, by perming the operation control to maintain the melting zone Ml in a state preventing a collapse, breakage or the like as the present embodiment is doing, it is possible to continue the crystal growth from the melting zone Ml. Further, since the characteristics of the melting zone Ml (melt temperature, viscosity, tension, etc.) may change over time, even if it is not always easy to model itself uniquely, by using the operation control in the present embodiment, it is possible to continue the crystal growth from the melting zone Ml. Further, even if modeling of the melting zone Ml may be difficult because the variation of the state of melting zone Ml does not uniquely correspond to the operating condition of the single crystal production apparatus 1, by using the operation control in the present embodiment, it is possible to continue the crystal growth from the melting zone Ml. Further, even if it is not feasible to create a control model after trying a considerable amount of various phenomena by trial operation in the single crystal production apparatus 1 in advance, by using the operation control in the present embodiment, it is possible to continue the crystal growth from the melting zone Ml. Further, unlike the type of reinforcement learning in which learning is performed while searching for the best action, according to the operation control in the present embodiment, it is possible to appropriately treat the real-time processing as well.

That is, according to the present embodiment, even if it is difficult to model the melting zone Ml as the controlled object uniquely and to control the operation so as to achieve the target state, it is possible to control the operation of the single crystal production apparatus 1 which handles the melting zone Ml so that the melting zone Ml maintains the predetermined shape state as a desired state.

(B) In the present embodiment, the operation control for the single crystal production apparatus 1 is periodically performed as cyclic processing. Depending on how the constraint determination values ΔR fluctuate due to the operation control at a certain timing, it reconfigures the control model expressions $\Delta C^j = F_j(\Delta R^1, \Delta R^2, \ldots, \Delta R^i)$ to be used thereafter. Therefore, according to the present embodiment, in order to perform control to prevent the shape of the melting zone Ml from deviating from the predetermined shape state, the control model expressions $\Delta C^j = F_j(\Delta R^1, \Delta R^2, \ldots, \Delta R^i)$ are reconfigured according to the control result. The learning effect is exhibited for the control content, whereby it becomes possible to maintain the state in which the melting zone Ml is formed with high accuracy. That is, even if it is difficult to model the melting zone Ml uniquely and to control the operation so as to achieve the target shape, the control result can be reflected in the new control content so as to exert the learning effect, whereby the operation control can be performed with the same accuracy as the case being modeled (C) In the present embodiment, the control model expressions $\Delta C^j = F_j(\Delta R^1, \Delta R^2, \ldots, \Delta R^i)$ are reconfigured according to how the constraint determination values ΔR vary, thereby the learning effect for the control contents is exerted. This means, without setting the initial values strictly for the updating items (for example, weighting variables) in the control model expressions $\Delta C^j = F_j(\Delta R^1, \Delta R^2, \ldots, \Delta R^i)$, by repeating the reconfiguration of the items, the learning effect may cause the updating items converge to a preferable state. Thus, when it is not necessary to set the initial value of the updating items strictly, even if it is difficult to model the melting zone Ml which is the controlled object or there is no past operation results for example, it is very suitable for performing appropriate operation control with respect to the melting zone Ml.

(D) In the present embodiment, after captured images of the shape of the melting zone Ml are acquired, the captured images are analyzed to extract feature values for the shape of the melting zone Ml. Therefore, according to the present embodiment, even if it is difficult to directly measure the shape of the controlled object, as in the melting zone Ml where the temperature is extremely high, it is possible to extract the feature values of the shape. Moreover, it is possible to realize shape recognition after smoothing processing on a plurality of captured images, for example, by using analysis of the captured images. Therefore, according to the present embodiment, even if the captured images acquired for the melting zone Ml which is the controlled object, are affected by the rotation, eccentricity or the like of the raw material grip portion 2 and the seed crystal grip portion 3, it is possible to perform shape recognition of the melting zone Ml after removing noise components and the like due to the influence thereof, and to improve the accuracy of the shape recognition.

(E) In the present embodiment, as a limit value to be compared with the feature values of the melting zone Ml which is the controlled object, it uses values corresponding to the boundary condition required for the melting zone Ml to maintain the predetermined shape state. Therefore, according to the present embodiment, automatic control can be performed to prevent the melting zone Ml from deviating from the predetermined shape state. Even if it is difficult to control so that the shape of melting zone Ml follows the target shape, the melting zone Ml can be easily and reliably maintained in a state where the crystal growth continues. It becomes very suitable for producing high purity and uniform single crystal Mc using the single crystal production apparatus 1 with high productivity.

(F) In the present embodiment, as the control model expressions $\Delta C^j = F_j(\Delta R^1, \Delta R^2, \ldots, \Delta R^i)$ for determining the control values ΔCj, it uses the equations for calculating the control values $\Delta C^j$ using the weighted averages of i types (ie, plural types) of the constraint determination values $\Delta R^1, \Delta R^2, \ldots, \Delta R^i$. Therefore, according to the present embodiment, it is possible to appropriately reflect how each constraint determination value $\Delta R^1, \Delta R^2, \ldots, \Delta R^i$ affects the calculation result of the control values $\Delta C^j$.

(G) In the present embodiment, as a control model expressions $\Delta C^j = F_j(\Delta R^1, \Delta R^2, \ldots, \Delta R^i)$ for determining the control value ΔCj, it uses the equations where weighted averages are taken in the exponential space and then the logarithm is taken back to the linear space. Therefore, according to the present embodiment, it is expected to improve the calculation accuracy of the control values $\Delta C^j$ by using the weighted averages in the exponential space.

(H) In the present embodiment, upon reconfiguring the control model expressions $\Delta C^j = F_j(\Delta R^1, \Delta R^2, \ldots, \Delta R^i)$ for determining the control value $\Delta C^j$, the weighting variables $\alpha_{11}, \alpha_{12}, \ldots, \alpha_{1i}$ are used as the updating items, and the reconfiguration is performed by updating the weighting variables $\alpha_{11}, \alpha_{12}, \ldots, \alpha_{1i}$ in the weighted average regarding the constraint determination values ΔR having a change. Therefore, according to the present embodiment, by repeating the reconfiguration cyclically in a predetermined period, the control model expressions $\Delta C^j = F_j(\Delta R^1, \Delta R^2, \ldots, \Delta R^i)$ change, thereby the fluctuation of the constraint determination values ΔR converge. Thus, the learning effect is exerted for the control contents using the control model expressions $\Delta C^j = F_j(\Delta R^1, \Delta R^2, \ldots, \Delta R^i)$. That is, it is very suitable to be applied when it is difficult to model the melting zone Ml which is the controlled object. Even in such a case, the operation control can be appropriately performed for reliably maintaining the melting zone Ml in a predetermined shape state.

(I) In the present embodiment, each unit 11 to 24 in the control device 6 cyclically performs a series of control processes (S102 to S112 in FIG. 4), where one cycle of the processing is completed within a prescribed time. Therefore, according to the present embodiment, the operation control for each of the components 2 to 5 in the single crystal production apparatus 1 can be performed in real time, in parallel with the production of the single crystal using the melting zone Ml in the single crystal production apparatus 1. It is very suitable for securing the real time processing for the operation control.

(J) In the present embodiment, the controlled object is the melting zone Ml formed between the raw material M and the seed crystal S when producing a single crystal by the single crystal production apparatus 1.

Therefore, according to the present embodiment, automatic control is performed to maintain the melting zone Ml in a predetermined shape (that is, a state in which crystal growth can be continued) without depending on the operator of the single crystal production apparatus 1. That is, it can easily and reliably maintain the state in which the melting zone Ml is formed and the crystal growth continues. Thus, high purity and homogeneous single crystal Mc can be produced with high productivity.

Moreover, according to the present embodiment, it specifies a state in which the crystal growth in the melting zone Ml can be continued, as a predetermined shape state, thereby the automatic control is performed to prevent the melting zone Ml from deviating from the predetermined shape state. Even if it is not easy to explicitly describe the melting zone Ml as one physical model and it is difficult to control the shape of the melting zone Ml to follow the target shape, the state in which the melting zone Ml is formed can be maintained easily and reliably. That is, even when it is difficult to define an ideal target value, control is performed so as not to deviate from the limit value that causes failure. Thereby, easily and reliably maintaining the state in which the melting zone Ml is formed, it makes possible to produce high purity and homogeneous single crystal Mc with high productivity.

(K) In the present embodiment, the single crystal production apparatus 1 handling the melting zone Ml which is the controlled object, performs single-crystal production using the AP method, that is, the raw material grip portion 2 is disposed at the vertically bottom position and the seed crystal grip portion 3 is disposed at the vertically top position. Therefore, according to the present embodiment, while the shape recognition for the melting zone Ml is based on the captured images of the melting zone Ml, the acquisition of the captured images can be performed from the lateral side of the melting zone Ml. This makes possible to minimize the complication of the device configuration for the image acquisition. Furthermore, the shape recognition of the melting zone Ml can be performed easily and accurately by using the captured images from the lateral side.

5. Modified Examples

One embodiment of the present invention is described concretely above. The technical scope of the present embodiment is not limited to the above-described embodiment, whereby it can be variously changed in the range within the gist.

(Single Crystal Production)

The above-described embodiment describes, as an example, the single crystal production apparatus 1 handling the melting zone Ml which is the controlled object, wherein it performs single crystal production using the AP method. The present embodiment can also be applied in the same manner in the case of single crystal production by the so-called floating zone (FZ) method in which the raw material grip portion 2 is disposed above and the seed crystal grip portion 3 is disposed below, for example, as described in Japanese Patent Application Laid-Open Publication No. 2015-081218. Even in that case, by performing automatic control to prevent the melting zone Ml formed between the seed crystal S and the raw material M from deviating from the predetermined shape state, the state of the melting zone Ml can be maintained easily and reliably so as to continue the crystal growth. This makes possible to produce high purity and homogeneous single crystal Mc with high productivity.

(Controlled Object and Machine Apparatus)

The above-described embodiment describes, as examples, the melting zone Ml necessary for crystal growth as a controlled object and the single crystal production apparatus 1 producing the single crystal as a machine apparatus for handling the controlled object are mentioned. The present embodiment is not limited to these, and can be applied to other controlled objects, machine apparatuses and the like in the same manner.

Other machine apparatuses may include various manufacturing devices, plant devices, transport devices, information processing devices and the like in which operations are controlled by using automatic control technology. That is, the term "machine apparatus" as used herein means an apparatus to perform some physical operation (including an information processing operation using hardware resources of a computer device) regardless of whether it is mechanical or electrical. The apparatus is configured being controlled by an instruction from a machine control device configured using a computer device.

Other controlled objects may include products handled by machine apparatuses, intermediates or processing media required for the production thereof, electrical signals at the time of processing, and the like. That is, the "controlled object" referred to in the present specification is an object to be handled by a machine apparatus (whether it is a mechanical or electrical object, regardless of whether it is a tangible or an intangible), whereby the object has a need to maintain a certain state when being handled in the machine apparatus.

That is, the controlled object and the machine apparatus are not limited to the contents mentioned in the above-described embodiment. They may be applied widely and generally regardless of whether they are mechanical or electrical, for those applicable for automatic control technology.

(Feature Extraction)

The above-described embodiment describes, as an example, the extraction of the feature values about the shape of melting zone Ml which is the controlled object. The present embodiment is not limited to this, and can be applied to not only those of the shape of the object but also those of the signal waveform, as long as they include the state as the controlled object.

Further, the embodiment describes, as an example for extracting the feature values, the acquisition of captured images of the melting zone Ml which is the controlled object and the analysis of the captured images to extract the feature values. The present embodiment is not limited to this, whereby the extraction of feature values may be performed using other known techniques.

Specifically, for example, the feature values may be extracted performing sensing by using an accelerometer, a gyro, etc., or a combination of an ultrasonic sensor and a laser, with respect to the direction and distance of the controlled object. This may makes feasible to perform operation control such that the controlled object does not fall or bump, that is, an attitude control of the controlled object.

It is also conceivable to extract feature values for processing using a computer device, that is, for example, an input amount or scheduled time of a computation task, a machine load for tasks and the like. It becomes feasible to perform operation control and the like to prevent the allocation of machine resources from being collapsed.

That is, the present embodiment may also be applied to other aspects in which operation control is performed for a machine apparatus based on a constraint determination value, as long as performing measurement regarding the state of the controlled object, comparing the measured result with a predetermined constraint condition, and obtaining a constraint determination value.

(Control Model Expressions)

The above-described embodiment describes, as an example of a control model expression, an equation for determining control values using a weighted average of constraint determination values. The present embodiment is not limited to this, whereby control model expressions can be equations that calculate the control values using a method other than weighted average, as long as it is predefined and the reconfiguration is applicable.

Further, the embodiment describes, as an example, update of the weighting variables for weighted averages for reconfiguring the control model expressions, since the control model expressions use weighted averages in the example. The present embodiment is not limited to this, whereby the method of reconfiguring the control model expressions is not particularly limited as long as it can exert a learning effect in which the fluctuation of the constraint determination values converges.

6. Preferred Aspects of the Present Invention

Hereinafter, some aspects of the present invention are supplementary noted.

[Supplementary Note 1]

According to one aspect of the present invention, there is provided a machine control device which is used by mounting on a machine apparatus that handles a controlled object or used by connecting to the machine apparatus, the machine control device including a measurement unit that performs measurement regarding a state of the controlled object, a determination unit that compares a measurement result with a predetermined constraint condition, the measurement result being obtained by the measurement unit, and determines a constraint determination value, a control unit that performs operation control for the machine apparatus based on the constraint determination value determined by the determination unit, according to a relationship set for the constraint determination value and the operation control, and a learning unit that reconfigures a relationship between the constraint determination value and the operation control when the constraint determination value changes due to the operation control performed by the control unit.

[Supplementary Note 2]

In some aspects, in the machine control device according to supplementary note 1, the measurement unit includes an image capture unit that acquires a captured image for the controlled object and an image analysis unit that analyzes the captured image acquired by the image capture unit and performs measurement regarding the state of the controlled object.

[Supplementary Note 3]

In some aspects, in the machine control device according to supplementary note 1 or 2, the measurement unit measures a feature value of the shape of the controlled object.

[Supplementary Note 4]

In some aspects, in the machine control device according to any one of supplementary notes 1 to 3, the determination unit uses a limit value as the constraint condition, the limit value being set for a measurement content obtained by the measurement unit, and uses a value corresponding to a boundary condition as the limit value, the boundary condition being required for the controlled object to maintain a predetermined state, and determines a proximity of the measurement result to the limit value as the constraint determination value, the measurement result being obtained by the measurement unit.

[Supplementary Note 5]

In some aspects, in the machine control device according to any one of supplementary notes 1 to 4, the relationship between the constraint determination value and the operation control is defined by a reconfigurable control model expression.

[Supplementary Note 6]

In some aspects, in the machine control device according to any one of supplementary notes 1 to 5, the measurement unit, the determination unit, the control unit, and the learning unit cyclically perform processing, and one cycle of the processing is completed within a prescribed time.

[Supplementary Note 7]

In some aspects, in the machine control device according to any one of supplementary notes 1 to 6, the machine apparatus is a single crystal production apparatus and the controlled object is a melting zone formed between a raw material and a seed crystal when producing a single crystal by the single crystal production apparatus.

[Supplementary Note 8]

According to another aspect of the present invention, there is provided a machine control program causing a computer mounted on a machine apparatus that handles a controlled object or a computer used by connecting to the machine apparatus, to execute performing measurement regarding a state of the controlled object, comparing a measurement result with a predetermined constraint condition, the measurement result being obtained by the performance of the measurement, and determining a constraint determination value, performing operation control for the machine apparatus based on the constraint determination value obtained by the determination of the constraint determination value, according to a relationship set for the constraint determination value and the operation control, and learning a reconfiguration of a relationship between the constraint determination value and the operation control when the constraint determination value changes due to the operation control.

[Supplementary Note 9]

According to still another aspect of the present invention, there is provided a machine control method controlling the operation of a machine apparatus that handles a controlled object, the method including performing measurement regarding a state of the controlled object, comparing a measurement result with a predetermined constraint condition, the measurement result being obtained by the performance of the measurement, and determining a constraint determination value, performing operation control for the machine apparatus based on the constraint determination value obtained by the determination of the constraint determination value, according to a relationship set for the constraint determination value and the operation control, and learning a reconfiguration of a relationship between the constraint determination value and the operation control when the constraint determination value changes due to the operation control.

[Supplementary Note 10]

According to still another aspect of the present invention, there is provided a machine control device which is used by mounting on a machine apparatus that handles a controlled object or used by connecting to the machine apparatus, the machine control device including a shape recognition unit that obtains a feature value of a state of the controlled object, a constraint determination unit that compares the feature value with a limit value, the feature value being obtained by the shape recognition unit and the limit value being set for the feature value, and determines a proximity of the feature value to the limit value as a constraint determination value, a control value decision unit that decides a control value for controlling operation for the machine apparatus, based on the constraint determination value determined by the constraint determination unit, using a control model expression that specifies a relationship between the constraint determination value and the control value, a sequence control unit that performs operation control for the machine apparatus based on the control value decided by the control value decision unit, and a model learning unit that reconfigures the control model expression used by the control value decision unit, according to how the constraint determination value changes due to the operation control performed by the sequence control unit, the constraint determination value being determined by the constraint determination unit.

[Supplementary Note 11]

In some aspects, in the machine control device according to supplementary note 10, the shape recognition unit includes an image capture unit that obtains a captured image of a shape of the controlled object and an image analysis unit that analyzes the captured image acquired by the image capture unit and extracts the feature value of the state of the controlled object.

[Supplementary Note 12]

In some aspects, in the machine control device according to supplementary note 10 or 11, the constraint determination unit uses a value corresponding to a boundary condition as the limit value, the boundary condition being required for the controlled object to maintain a predetermined shape state.

[Supplementary Note 13]

In some aspects, in the machine control device according to any one of supplementary notes 10 to 12, the control value decision unit uses an equation as the control model expression, the equation calculating the control value using a weighted average of a plurality of the constraint determination values and the model learning unit reconfigures the control model expression by updating a weighting variable of the weighted average regarding the constraint determination value having a change.

[Supplementary Note 14]

In some aspects, in the machine control device according to supplementary note 13, the control value decision unit uses an equation as the control model expression, the equation taking the weighted average in an exponential space and taking a logarithm being returned to a linear space.

[Supplementary Note 15]

In some aspects, in the machine control device according to any one of supplementary notes 10 to 14, the shape recognition unit, the constraint determination unit, the control value decision unit, the sequence control unit, and the model learning unit cyclically perform processing in a time set based on a time constant regarding the controlled object and the machine apparatus, and the processing of one cycle is completed within a prescribed time.

[Supplementary Note 16]

In some aspects, in the machine control device according to any one of supplementary notes 10 to 15, the machine apparatus is a single crystal production apparatus and the controlled object is a melting zone formed between a raw material and a seed crystal when producing a single crystal by the single crystal production apparatus.

[Supplementary Note 17]

According to still another aspect of the present invention, there is provided a machine control program causing a computer mounted on a machine apparatus that handles a controlled object or a computer used by connecting to the machine apparatus, to execute recognizing a feature value of a state of the controlled object, comparing the feature value with a limit value, the feature value being obtained by the recognition of the feature value and the limit value being set for the feature value, and determining a proximity of the feature value to a limit value as a constraint determination value, deciding a control value for controlling operation for the machine apparatus, based on the constraint determination value obtained by the determination of the constraint determination value, using a control model expression that specifies a relationship between the constraint determination value and the control value, performing operation control for the machine apparatus based on the control value obtained by the decision of the control value, and learning a reconfiguration of the control model expression obtained by the use of the control model expression, according to how the constraint determination value changes due to the operation control, the constraint determination value obtained by the determination of the constraint determination value.

[Supplementary Note 18]

According to still another aspect of the present invention, there is provided a machine control method controlling the operation of a machine apparatus that handles a controlled object, the method including recognizing a feature value of a state of the controlled object, comparing the feature value with a limit value, the feature value being obtained by the recognition of the feature value and the limit value being set for the feature value, and determining a proximity of the feature value to a limit value as a constraint determination value, deciding a control value for controlling operation for the machine apparatus, based on the constraint determination value obtained by the determination of the constraint determination value, using a control model expression that specifies a relationship between the constraint determination value and the control value, performing operation control for the machine apparatus based on the control value obtained by the decision of the control value, and learning a reconfiguration of the control model expression obtained by the use of the control model expression, according to how the constraint determination value changes due to the operation control, the constraint determination value obtained by the determination of the constraint determination value.

DESCRIPTION OF SIGNS AND NUMERALS

1 Single crystal production apparatus (machine apparatus)
2 Raw material grip portion
3 Seed crystal grip portion
4, 5 Heating part
6 Machine control apparatus (control apparatus)
10 Shape recognition unit (measurement unit)
11 Image capture unit
12 Image analysis unit
20 Operation control unit
21 Constraint determination unit (determination unit)
22 Control value decision unit (control unit)
23 Sequence control unit (control unit)
24 Model learning unit (learning unit)
M Raw material
Mc Single crystal
Ml Melting zone (controlled object)
S Seed crystal

The invention claimed is:

1. A machine control device which is used by mounting on a machine apparatus that handles a controlled object or used by connecting to the machine apparatus, the machine control device comprising:

a measurement unit that performs measurement of a feature value specifying a state of the controlled object;

a determination unit that compares the feature value with a constraint condition that is a boundary condition for maintaining a predetermined state of the controlled object and specified by a limit value permitted for the feature value, the feature value being obtained by the measurement unit, and determines a constraint determination value that specifies a relationship of the feature value to the constraint condition;

a control unit that performs operation control for the machine apparatus to prevent the feature value from deviating from the boundary condition, based on the constraint determination value determined by the determination unit, according to a relationship set for the constraint determination value and the operation control; and a learning unit that reconfigures a relationship between the constraint determination value and the operation control according to how the constraint determination value changes to the limit value due to the operation control when the constraint determination value changes due to the operation control performed by the control unit.

2. The machine control device according to claim 1, wherein the measurement unit includes an image capture unit that obtains a captured image for the controlled object and an image analysis unit that analyzes the captured image acquired by the image capture unit and performs measurement of the feature value specifying the state of the controlled object.

3. The machine control device according to claim 1, wherein the determination unit determines a proximity of the feature value to the limit value as the constraint determination value, the feature value being obtained by the measurement unit.

4. The machine control device according to claim 1, wherein the relationship between the constraint determination value and the operation control is defined by a reconfigurable control model expression.

5. The machine control device according to claim 1, wherein the measurement unit, the determination unit, the control unit, and the learning unit cyclically perform processing, and one cycle of the processing is completed within a prescribed time.

6. The machine control device according to claim 1, wherein the machine apparatus is a single crystal production apparatus and the controlled object is a melting zone formed between a raw material and a seed crystal when producing a single crystal by the single crystal production apparatus.

7. The machine control device according to claim 1, wherein the measurement unit obtains a plurality of types of measurement results and the determination unit determines one or more constraint determination values corresponding to each of the plurality of types of measurement results.

8. The machine control device according to claim 1, wherein
the measurement unit includes an image sensor, and
a processor is programmed to function as the determination unit, the control unit and the learning unit.

9. A non-transitory computer readable medium storing a machine control program that causes: (a) a computer mounted on a machine apparatus that handles a controlled object, or (b) a computer used by connecting to the machine apparatus, to perform steps comprising:

performing measurement of a feature value specifying a state of the controlled object;

comparing the feature value with a constraint condition that is a boundary condition for maintaining a predetermined state of the controlled object and specified by a limit value permitted for the feature value, the feature value being obtained by the performance of the measurement, and determining a constraint determination value that specifies a relationship of the feature value to the constraint condition;

performing operation control for the machine apparatus to prevent the feature value from deviating from the boundary condition, based on the constraint determination value obtained by the determination of the constraint determination value, according to a relationship set for the constraint determination value and the operation control; and learning a reconfiguration of a relationship between the constraint determination value and the operation control according to how the constraint determination value changes to the limit value due to the operation control when the constraint determination value changes due to the operation control.

10. A machine control method controlling the operation of a machine apparatus that handles a controlled object, the method comprising:

performing measurement of a feature value specifying a state of the controlled object;

comparing the feature value with a constraint condition that is a boundary condition for maintaining a predetermined state of the controlled object and specified by a limit value permitted for the feature value, the feature value being obtained by the performance of the measurement, and determining a constraint determination value that specifies a relationship of the feature value to the constraint condition;

performing operation control for the machine apparatus to prevent the feature value from deviating from the boundary condition, based on the constraint determination value obtained by the determination of the constraint determination value, according to a relationship set for the constraint determination value and the operation control; and learning a reconfiguration of a relationship between the constraint determination value and the operation control according to how the constraint determination value changes to the limit value due to the operation control when the constraint determination value changes due to the operation control.

* * * * *